United States Patent [19]

Juzswik et al.

[11] Patent Number: 5,495,155

[45] Date of Patent: Feb. 27, 1996

[54] DEVICE IN A POWER DELIVERY CIRCUIT

[75] Inventors: David L. Juzswik, Dearborn Heights; Bruce R. Wrenbeck, Dearborn, both of Mich.

[73] Assignee: United Technologies Corporation, Dearborn, Mich.

[21] Appl. No.: 344,537

[22] Filed: Nov. 23, 1994

Related U.S. Application Data

[63] Continuation of Ser. No. 59,145, May 7, 1993, abandoned, which is a continuation of Ser. No. 723,143, Jun. 28, 1991, Pat. No. 5,210,475.

[51] Int. Cl.$^6$ .............................. H02P 1/22; G05F 3/16
[52] U.S. Cl. ................. 318/293; 318/256; 318/280; 318/287; 318/291; 323/315; 323/316
[58] Field of Search .................... 318/256, 257, 318/280, 283, 284, 287, 289, 291, 293, 430, 432, 433, 434; 323/311, 312, 313, 315, 316; 330/257, 288, 307; 363/63, 132

[56] References Cited

U.S. PATENT DOCUMENTS

| | | | |
|---|---|---|---|
| Re. 30,297 | 6/1980 | Wittlinger . | |
| 4,477,737 | 10/1984 | Ulmer et al. . | |
| 4,494,181 | 1/1985 | Ramlohr et al. ......................... | 363/63 |
| 4,528,496 | 7/1985 | Naokawa et al. ....................... | 323/315 |
| 4,533,845 | 8/1985 | Bynum et al. . | |
| 4,550,284 | 10/1985 | Sooch . | |
| 4,562,386 | 12/1985 | Goff et al. ............................... | 318/254 |
| 4,575,662 | 3/1986 | Lehnhoff ................................. | 318/282 |
| 4,616,305 | 10/1986 | Damiano et al. ....................... | 318/293 |
| 4,654,568 | 3/1987 | Mansmann ............................. | 318/293 |
| 4,667,121 | 5/1987 | Fay et al. ................................ | 307/580 |
| 4,677,323 | 6/1987 | Marsh . | |
| 4,705,997 | 11/1987 | Juzswik ................................... | 318/443 |
| 4,710,685 | 12/1987 | Lehnhoff et al. ....................... | 318/293 |
| 4,710,686 | 12/1987 | Guzik ...................................... | 318/293 |
| 4,719,396 | 1/1988 | Shimizu .................................. | 318/432 |
| 4,769,619 | 9/1988 | Taylor ..................................... | 330/288 |
| 4,859,929 | 8/1989 | Raguet . | |
| 4,866,312 | 9/1989 | Kearney et al. ........................ | 307/496 |
| 4,885,477 | 12/1989 | Bird et al. .............................. | 307/296.8 |
| 5,013,934 | 5/1991 | Hobrecht et al. ...................... | 307/296.7 |
| 5,021,682 | 6/1991 | Hobrecht ................................ | 307/296.8 |
| 5,032,745 | 7/1991 | Izadinia et al. ........................ | 307/571 |
| 5,032,774 | 7/1991 | Juzswik ................................ | 318/256 X |
| 5,245,523 | 9/1993 | Juzswik .................................. | 363/56 |

OTHER PUBLICATIONS

A Current Sensing Circuit, Drawing No. 981–085, from International Rectifier, El Segundo, California, 1988.

IEEE Power Electronics Specialists Conference, (PESC) '88 Record, vol. 2, 11 Apr. 1988, Kyoto JP, pp. 1319–1324; Jeffrey G. Mansmann et al: "ASIC like HVIC for interfacing to half-bridge based power circuits" *the whole document*.

(List continued on next page.)

*Primary Examiner*—Bentsu Ro
*Attorney, Agent, or Firm*—Niro, Scavone, Haller & Niro

[57] ABSTRACT

An improved current sensing circuit is provided in, or for use with, a power delivery circuit having a current controlling device of the type which includes auxiliary current sensing terminals. The current sensing circuit is particularly useful in conjunction with a respective current sensing power MOSFET located in the "high side" of a switching circuit, such as an H-bridge switch for a bidirectional load. The current sensing circuit has two branches connected to the current sensing MOSFET and to a reference potential and constructed to provide an output voltage signal representative of the main current through the current sensing MOSFET. The first branch includes at least two transistors and a resistor serially connected between a current sense terminal of the MOSFET and a reference potential. The second branch also includes at least two serially connected transistors connected between a terminal of the MOSFET and the reference potential. The transistors are cross-connected between branches and provide an inverted current mirror and a current mirror. Fifth and sixth transistors may also be included as part of the current sensing circuit.

30 Claims, 3 Drawing Sheets

OTHER PUBLICATIONS

Electro/86 and Mini/Micro Northeast Conference Record, vol. 11, 1986, Los Angeles US, pp. 1–4; Donald L. Zaremba, Jr.: "How current sense technology improves POWER MOSFET switching application"* p. 3, left–hand column, graph 1—p. 4, left–hand column, last paragraph; FIGS. 7a–9b*.

Electro/87 and Mini/Micro Northeast Conference Record, vol. 12, 1987, Los Angeles US, pp. 1–8; Artusi et al: "New smartpower devices ease the facing to power loads"* p. 1, left–hand column, paragraph 2—p. 4, left–hand column, paragraph 3; FIGS. 1, 3, 6*.

Integrated Circuit Engineering, Design, Fabrication and Applications, Glaser and Subak–Sharpe, pp. 503–508 & 515, Addison–Wesley Publishing Co., 1977.

Bipolar and MOS Analog Integrated Circuit Design, A. B. Grebene, pp. 169–187, John Wiley & Sons, 1984.

Analysis and Design of Integrated Electronic Circuits, Paul M. Chirlian, pp. 132–134, Harper & Row, Publishers, New York, 1981.

VLSI Handbook, Joseph Di Giacomo, pp. 29.14–29.15, McGraw Hill, 1989.

Electronic Devices and Circuits, Third Edition, D. A. Bell, pp. 398–399, pp. 531, 537–538, Prentice–Hall, 1986.

Integrated Circuits and Semiconductor Devices: Theory and Application, Second Edition, Deboo and Burrous, pp. 23, 91–92, McGraw–Hill, 1977.

Modern MOS Technology: Process, Devices, and Design, DeWitt G. Ong, pp. 230–231, McGraw–Hill, 1984.

Microelectronics, Second Edition, Millman and Grabel, pp. 123–125 & 394–402 McGraw–Hill Book Company, 1987.

Electronic Devices and Circuit Theory, Third Edition, Boylestad and Nashelsky, pp. 507–509, Prentice–Hall, 1982.

Electronic Integrated Systems Design, Hans R. Camenzind, Microelectronics Series, pp. 236–244, Van Nostrand Reinhold Co., New York, 1972.

"Electronic Circuits Digital and Analog", Charles A. Holt, p. 483 John Wiley & Sons, New York, 1978.

The Art of Electronics—Second Edition, Paul Horowitz and Winfield Hill—pp. 88–91—Cambridge University Press—1989 .

"Microelectronic Circuits"—Adel S. Sedra and Kenneth C. Smith—pp. 433–436—Holt, Rinehart and Winston, 1982.

Nathan Zommer & Joseph Biran, IXYS Corporation, "Power Current Mirror Devices and their Applications", Sep. 1986, PCIM, pp. 14, 18 and 20.

IXYS/Samsung Joint Venture: Automotive Hi–Side Driver: file: Hi–Drv.SPC Nov. 25, 1987, p. 1, Nov. 1987.

Motorola Semiconductor Technicla Data, "Product Review, SMARTpower High Side Logic–to–Power Switch", Motorola Inc., 1986, p. NP198.

Miles, Semiconductor Devices and Integrated Electronics, pp. 377–381 (Van Nostrand Reinhold Co. 1980).

Alberkrack et al., A New High Performance Current Mode Controller Teams Up With Current Sensing Power MOSFETS, Motorola Semiconductor Application Note AN976(1986).

Goodenough, MOSFET Measures Current With No Loss, Electronic Design Magazine, pp. 59–60 (Feb. 20, 1986).

IR Document No. 2343, Fax from J. Fishbein to S. Weiner, dated Aug. 30, 1990.

IR Document No. 2344, Everest & Jennings current sensing circuit, of Jul. 24, 1987.

IR Document No. 2346, part list, IR Drawing No. 981–085, Jul. 21, 1987.

IR Document No. 2345, current sensing circuit, IR Drawing No. 981–085 of Jul. 21, 1987.

DEVICE IN A POWER DELIVERY CIRCUIT

This is a continuation of application Ser. No. 08/059,145 filed on May 7, 1993, now abandoned, which is a continuation of 07/723,143, filed Jun. 28, 1991 now U.S. Pat. No. 5,210,475.

TECHNICAL FIELD

The invention relates generally to current sensing circuitry and more particularly to current sensing circuitry in combination with, or for use in combination with, a current controlling device in a power delivery circuit. More particularly, the invention relates to a current sensing circuit for detecting current conditions in a power delivery circuit, especially of the high-side switch type. The invention even more particularly relates to a current sensing circuit useful for detecting over-current conditions in "H"-bridge-type power delivery circuits for bidirectional motors and in which the current controlling devices are provided by current sensing semiconductors.

BACKGROUND ART

The advent of solid state power drivers has created the need to monitor or to sense load current for device protection and other functions. The power delivery circuits for supplying load current to a load and which further include current sensing capabilities are generally known and are of diverse types. In U.S. Pat. No. 4,654,568 to Mansmann, there is disclosed an H-bridge switch circuit for a load such as a motor. More specifically, the various switches of the H-bridge are MOSFET semiconductors, with two of those MOSFETs comprising current sensing MOSFETs. In that described embodiment, the current sensing MOSFETs are connected in the "low" side of the power delivery circuit to the motor. The current sensing MOSFETs are multi-cellular devices in which a major current-carrying cellular portion consists of a large number of cells connected in parallel for carrying the main load current and in which a minor current-carrying cellular portion consists of a relatively small number of cells substantially in parallel therewith and having a separate terminal for carrying a current proportional to that load current. That separate terminal is termed the "current sensing" terminal and may be useful for developing a signal indicative of the major current carried by the current sensing MOSFET.

In U.S. Pat. No. 4,654,568, the current conducted via the current sensing terminal is developed as a voltage level which is applied to an input of an operational amplifier for amplification and subsequent evaluation. The current sensing circuit which converts the current carried at the current sensing terminal to a corresponding voltage level appears in the patent as at least one sensing resistor operatively connected between the current sensing terminal and ground. The operational amplifier is connected to the current sense terminal and amplifies the voltage developed across that resistor (sense voltage). Sensing current in this manner inherently induces errors in the ratioing of the majority current and the sensing current in the current sense MOSFET. More significantly, as the temperature of the current sense MOSFET increases, as under increasing load conditions, the aforementioned induced error percentage and likewise associated sense voltage error percentage increases.

Furthermore, for safety reasons required in automotive applications, power switch protection and current sensing need to be implemented in a "high side" configuration. This configuration places the current switch or power switch in between the positive supply and the load. If the current sensing method demonstrated in U.S. Pat. No. 4,654,568 were to be used in a high side configuration, it would have all of the previously described problems. Further, the operational amplifier supply voltage would have to be higher than the sum of the current sense terminal voltage and the amplified voltage drop across the sensing resistor. Since the voltage drops across the current sense MOSFETs (power MOSFETs) are very low, this would required an operational amplifier voltage supply to be higher than the voltage supply connected to the current sense MOSFET, which is typically the battery, $V_{BATT}$, in automotive applications. This method is further complicated by requiring the threshold reference voltage, which needs to be generated and used for comparing the amplified resistor voltage drop to some threshold for protection, to be operatively referenced above the current sense terminal potential, which is changing with varying load conditions and battery voltage.

Alternatively, an operational amplifier could be connected in a current amplifier configuration, sometimes called a virtual ground reference, instead of a voltage amplifier configuration. This would require the operational amplifier to have a high common mode input voltage nearly equal to the supply voltage, a threshold reference voltage to be operatively referenced below the current sense terminal potential which is changing with varying load conditions and battery voltage, and would require an operational amplifier to work at the high voltage transients that are present in automotive applications (typically filtered to 45 volts).

DISCLOSURE OF THE INVENTION

Accordingly, it is a principal object of the present invention to provide an improved current sensing circuit for use in conjunction with a current controlling device such as a current sensing MOSFET, connected to respective ones of two auxiliary terminals associated with the current sensing MOSFET. Included within the object is the provision of such current sensing circuit having a constant load current ($I_L$)-to-voltage sense ($V_S$) conversion ratio which is independent of variations in the supply potential and in the load current.

It is a further object of the invention to provide a current sensing circuit of the type described which is particularly suited for use with a current sensing device or switch in a "high side" configuration and which exhibits improved accuracy.

It is a still further object of the invention to provide a current sensing circuit of the type described in which such improvements in accuracy and stability are obtained with a concomitant minimization of cost and complexity associated with the number of resistors required.

In accordance with the present invention, an improved current sensing circuit is provided for use in combination with a current controlling device in a power delivery circuit for supplying load current to a load. The invention finds particular utility in power delivery circuits in which the current controlling device is in the "high side", and especially in the high side of an H-bridge switch arrangement. The current controlling device or switch, which may be a current sensing MOSFET, comprises a multi-cellular device with a major current carrying cellular portion and a minor current carrying portion, a first main current terminal, a gate terminal for receiving a control signal, a second main current terminal connecting the major current-carrying cellular portion, a first auxiliary terminal, or current sense terminal, connected at one end to the minor current-carrying cellular portion so as to provide a current generally proportional to the main device current, and a second auxiliary terminal, the Kelvin terminal, connected at one end to the major current-carrying cellular portion.

The improved current sensing circuit includes first and second branches each connected at one end to a respective one of the first and second auxiliary terminals and includes means for connection in common at the other end to a reference potential in the power delivery circuit. More specifically, the current sensing circuit comprises the first branch including first and third series-connected semiconductor devices, such as transistors; the second branch including second and fourth series-connected semiconductor devices, such as transistors; the first and fourth semiconductor devices each being controlled by bias signals and acting in a transimpedance mode of operation; the second and third semiconductor devices being cross-connected with the first and fourth semiconductor devices respectively to provide the respective bias signals thereto; and the first branch further including impedance means, such as a resistor, connected in series circuit therewith for providing a voltage at a node at one end of the impedance means approximately proportional to the main device current, that node being connectable to a detection circuit.

In accordance with an embodiment of the invention, the first, second, third and fourth semiconductor devices comprise respective bipolar transistors, and the first and second transistors are of one conductivity type and the third and fourth transistors are of the opposite conductivity type. Further, the first main current terminal of the current controlling device is adapted to be connected to one polarity of a source of power having relatively opposite polarities, the second main current terminal of the current controlling device is adapted to be connected to one side of a load, and the other side of the load is adapted to be connected to the other polarity of the source of power. The current controlling device with the current sensing capability is preferably connected in the "high side" of the power delivery circuit such that it is relatively more positive than the load. Both the first and the second transistors are PNP transistors and the third and fourth transistors are NPN transistors. The reference potential in the power delivery circuit, to which the first and second branches of the sensing circuit are adapted to be connected in common, is the other polarity of the source of power, and is typically ground.

The betas ($\beta$) of the first and second transistors are substantially identical and the betas of the third and fourth transistors are substantially identical.

Further in accordance with the invention, the second and third transistors are each connected in respective shorted base-to-collector configurations and the base of the second transistor is connected to the base of the first transistor and the base of the third transistor is connected to the base of the fourth transistor. The impedance means in the first branch is a first resistor. In one embodiment, the second branch circuit includes a respective second resistor in series circuit therewith. In an alternate embodiment, a single resistor is connected in common in the first and the second branches and is connected to the reference potential.

In a further embodiment, still further improvement in performance of the current sensing circuit may be realized through the addition of fifth and sixth transistors thereto as an alternative to or modification of the shorted base-to-collector connections. The circuit becomes less sensitive to beta variations, and thus temperature, in the other four transistors.

In a still further embodiment, fifth and sixth transistors are added to the current sensing circuit, a respective one being serially connected in each of the branches intermediate the other transistors. The respective fifth and sixth transistors provide the major voltage drops thereacross to minimize the voltage across the other transistors and thereby minimize variations in the betas of those other four transistors despite variations in the supply voltage.

BEST MODES FOR CARRYING OUT THE INVENTION

Figure 1:
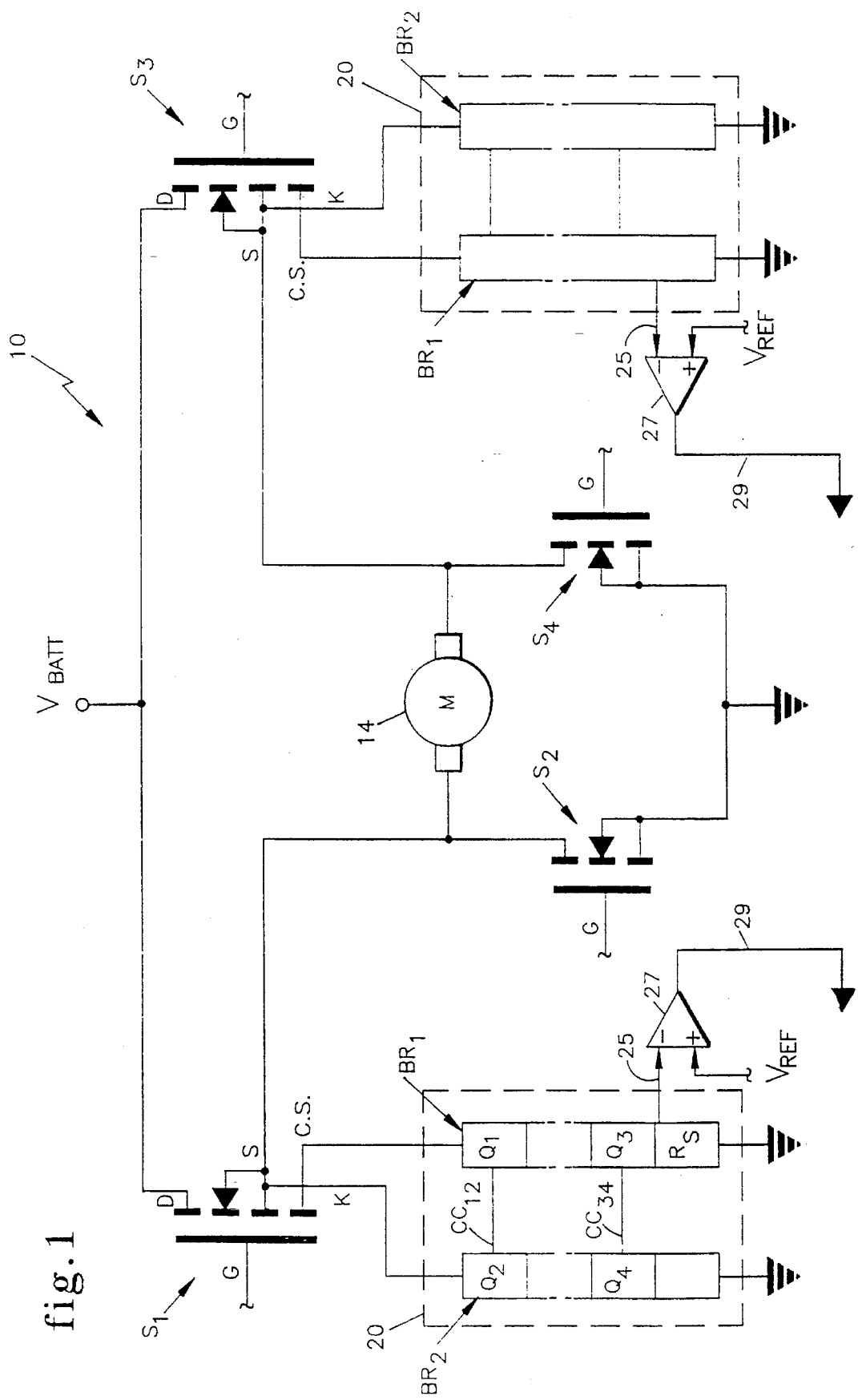
FIG. 1 is a schematic illustration partially in block diagram form providing a generalized view of the current sensing circuit of the invention, connected in operative association with current controlling devices, such as current sensing switches, in an H-bridge switch arrangement.

As an alternative to the aforementioned current sensing circuit of U.S. Pat. No. 4,654,568, there has recently been developed a refinement employing a type of current mirror, or more particularly, an inverted current mirror, employing at least two transistors. The transistors are connected in a pair of branch circuits which are connected, respectively, to the current sensing terminal and to a Kelvin terminal associated with the main, or source, terminal of a current sensing MOSFET. They provide a buffering action which causes or tends to cause, the Kelvin and the current sense terminals to be maintained at the same potentials. Such condition is required for sensing accuracy in the current sense MOSFET. One of the inventors herein is a joint inventor of such circuit.

The current sensing circuit mentioned in the immediately preceding paragraph employs a total of two, or preferably three, transistors between the two branches of the inverted current mirror. Moreover, the current sensing MOSFETs and associated current sensing circuitry find particular utility in "high side" applications of H-bridge and high-side switch arrangements, as distinct from the "low" side utilization disclosed in U.S. Pat. No. 4,654,568. In the two-transistor configuration of the current sensing circuit associated with one of the current sensing MOSFETs, one of the transistors is connected in one branch and the other transistor is connected in the other branch, and the bases of the transistors are joined in common. The preferred circuit uses matched PNP transistors. The transistor whose emitter is connected to the Kelvin terminal is connected in a shorted base-to-collector configuration. The emitter of the transistor in the other branch is connected to the current sense terminal. The collector of the transistor having the shorted baseto-collector is connected to a biasing resistor having its other end connected to a reference potential, such as ground, in the power delivery circuit. The collector of the other transistor is connected to one end of a sensing resistor having its other end also connected to the aforementioned referenced potential in the power delivery circuit.

The three-transistor current sensing circuit is similar to the two-transistor circuit described in the immediately preceding paragraph, however it achieves improved current sensing accuracy due to making the circuitry less sensitive to beta ($\beta$) and thus temperature by including the base-emitter junction of a third transistor in the connection which effectively shorts the base and collector of one of the transistors. The collector of the third transistor is connected to the reference potential.

Although the current sensing circuits which employ a plurality of matched transistors in an inverted current mirror configuration do provide certain advantages over the current sensing circuitry associated with the aforementioned U.S. Pat. No. 4,654,568, they still exhibit certain limitations when the supply voltage in the power delivery circuit varies, such that they maintain a constant current proportionality between the sense current and the load current over only a limited load current range. These limitations manifest themselves as errors in the current sensing MOSFET(s) ratio or proportionality and in the sensing circuits connected thereto. However, the circuitry of the present invention overcomes most of those limitations.

Referring now to the drawings depicting the present invention, like reference numerals refer to like parts unless otherwise noted.

FIG. 1 depicts the current sensing circuit of the invention in a generalized block diagram form and connected in operative association with one or more current controlling devices, and specifically current sensing switches, which are in turn connected in a power delivery circuit to a load. More particularly, the current sensing switches are part of an H-bridge switching arrangement for providing bidirectional control of the load device. More particularly still, and of significant importance to the invention, each current sensing switch to which the current sensing circuitry of the invention is connected appears in the "high", or relatively more positive, side of the power delivery circuit relative to the load device.

In FIG. 1, an H-bridge circuit 10 includes a load 14, such as a bidirectional electrical motor. The upper, or "high" side, arms of the H-bridge circuit 10 is connected to a relatively positive power supply potential, in this instance $V_{BATT}$ which may correspond with the battery supply voltage in a vehicle. The lower, or "low" side, arms of the H-bridge circuit 10 are connected to the opposite polarity of the power supply, which in this instance is connected to ground potential. Ground potential serves as the reference potential for the power supply circuit.

Connected in the upper left and upper right arms of the H-bridge 10 are current controlling devices having a current sensing capability and specifically, current-sensing power switches $S_1$ and $S_3$, respectively. The current sensing switches $S_1$ and $S_3$ represent a type of power carrying field effect transistor which is multi-cellular, and includes a major current carrying cellular portion and a minor current carrying cellular portion. The particular transistors have a large number of cells. The majority of the cells are connected electrically in parallel in the major current path and constitute the major current carrying portion; however, the remaining minority of the cells are interconnected with the majority of cells only via their gate and drain electrodes but provide a separate current sensing electrode, "C.S." for carrying a very small fraction of the current carried by the transistor, and thus constitute the minor current carrying portion. The current sensing MOSFETs $S_1$ and $S_3$ include a gate terminal G for control, major current-carrying terminals represented by the drain D and by the source S, a first auxiliary terminal, C.S., connected at one end to the minority of cells in the sensing MOSFET $S_1$ so as to provide a current generally proportional to the main device current, and a second auxiliary terminal, generally designated the Kelvin terminal, K, connected at one end to the majority of the cells of switch $S_1$ and substantially electrically in common with the source terminal.

Typically, the direction of rotation of motor 14 will be controlled by causing current flow therethrough in one direction or the other. Thus, for example, current sensing switch $S_1$ in the upper left leg and switch $S_4$ in the lower right leg will be caused to conduct concurrently for motor rotation in one direction. In such instance, current from the source $V_{BATT}$ will flow via the drain terminal D of current sensing switch $S_1$, and includes the major component of current supplied to the other polarity (i.e., ground potential) of the power supply via the power switch $S_4$ and the motor 14 from the source terminal S and the majority of cells in the current sensing switch $S_1$. A current proportional to but less than, the main current at terminal S is in turn provided via the minority cells at the current sense terminal C.S. Typically, the ratio of cells or major current carrying cellular portion to minor current carrying cellular portion, and thus of currents, may be on the order of 1000:1.

To provide a signal which is proportional to the main current carried by the source terminal S, it is necessary, or at least highly preferable, that the potential at the C.S. terminal be the same as that at the source terminal S. Accordingly, an auxiliary contact designated the Kelvin contact K is electrically connected to the source terminal S and provides a signal representative of the potential at the source terminal. As will be hereinafter appreciated, the current sensing circuit associated with current sensing MOSFET $S_1$ endeavors to maintain the potential at the Kelvin terminal K and the current sense terminal C.S. equal to one another.

To develop the signal representative of the current carried by the current sensing switch $S_1$, a current sensing circuit, generally depicted within the broken line block 20 of FIG. 1, is operatively connected with the Kelvin and the current sense terminals of current-sensing switch $S_1$ and to an appropriate potential associated with the power delivery circuit. Circuit 20 provides an output signal 25 to a comparator 27 for subsequent use in a known manner.

Specifically, the signal 25 appearing from sensing circuit 20 is a voltage level representative of the current in terminal C.S. of switch $S_1$, which is in turn proportional to the main current in switch $S_1$ and thus normally also through the load 14. A reference voltage $V_{REF}$, is selected and connected to the "+" input of comparator 27 for comparison with the current-converted to-voltage signal 25 appearing at the "−" input of that comparator. The potential of $V_{REF}$ is selected, in conjunction with circuit 20, to be representative of some threshold value of current in the current sense MOSFET circuit which is to be detected and indicated via the output of the comparator on line 29. Thus, so long as the voltage on line 25 is less than that of $V_{REF}$, the current in the current sense MOSFET, and normally through the H-bridge is presumed to be less than the monitored threshold value; whereas if the voltage on line 25 exceeds the $V_{REF}$, the comparator 27 provides an output 29 which indicates that the current in the H-bridge, or at least through current sensing MOSFET exceeds the monitored threshold value. It will be appreciated that signal 25 could be connected to an A-to-D converter or multiple comparators so as to monitor continuous or multiple current levels.

In order for the signal 25 from current sensing circuit 20 to be as representative as possible of the current in the H-bridge, or at least through the current sense MOSFET, it is necessary that its derivation be accomplished in a manner which is not adversely impacted by excursions in the power supply potential $V_{BATT}$ and/or by temperature excursions in the circuitry and/or by load current excursions, In this regard, the current sensing circuitry 20 of the present invention is believed to be particularly well-suited. It should be noted that another current sensing circuit, also designated 20, is associated with the Kelvin terminal K and the current sense terminal C.S. of the current sensing MOSFET $S_3$ in the upper right arm of the H-bridge 10. It is of identical construction to the current sensing circuit 20 associated with current sensing MOSFET $S_1$.

Referring now to the current sensing circuit 20 depicted very generally in block form at the lower left of FIG. 1, there appear two serial branches $BR_1$ and $BR_2$, each of which includes at least two semiconductor devices, such as bipolar transistors or the like in which one is used in a transimpedance mode of operation. Serial branch $BR_1$ is connected at one end to the current sense terminal C.S. of current sensing switch $S_1$ and is connected at its other end to a reference potential in the power delivery circuit, in this instance, ground potential. Similarly, serial branch $BR_2$ is connected at one end to the Kelvin terminal K of current sensing switch $S_1$ and is connected at its other end to the same reference potential in the power delivery circuit, in this instance, ground potential.

In branch $BR_1$, there are two semiconductor devices $Q_1$ and $Q_3$ connected in serial circuit. Similarly, in branch $BR_2$ there are two other semiconductor devices, $Q_2$ and $Q_4$, connected in serial circuit therein. More particularly still, the semiconductor devices, which hereinafter for convenience will be referred to as transistors, are cross-connected to provide a particular bias control. Specifically, transistor $Q_2$ is cross-connected via lead $CC_{12}$ to transistor $Q_1$ operating in the transimpedance mode to provide bias control to the latter. Similarly, transistor $Q_3$ is cross-connected via lead $CC_{34}$ to transistor $Q_4$ operating in the transimpedance mode to provide bias control to the latter.

A sensing resistor $R_S$ is shown in serial circuit with transistors $Q_1$ and $Q_3$ in branch $BR_1$ for developing the voltage signal 25 extended to comparator 27. Though the sensing resistor is shown in the generic circuit of FIG. 1 as being the only resistor depicted in the current sensing circuit 20 and further as being connected between transistor $Q_3$ and ground, it will be understood that other resistors might be included elsewhere in the branch circuits $BR_1$ and $BR_2$ and further, that the sensing resistor $R_S$ might be connected between transistors $Q_1$ and $Q_3$ in branch circuit $BR_1$. It also will be understood that a capacitor can be included electrically in parallel with the sense resistor $R_S$ which will bypass potential current spikes caused by turn-on and turn-off of the current sense MOSFET.

The described branch circuits $BR_1$ and $BR_2$ serve to provide, via transistors $Q_1$ and $Q_2$, an impedance-matching buffer, or pseudo or inverted current mirror, in the upper portion of the circuit 20 and connected to the terminals C.S. and K, whereas transistors $Q_3$ and $Q_4$ in the lower portion of circuit 20 define a more conventional current mirror. The bottom two transistors, $Q_3$ and $Q_4$, operate in current-mirror fashion to maintain near-equal collector currents, and therefore base-emitter voltages, through the upper transistors $Q_1$ and $Q_2$.

Figure 2:
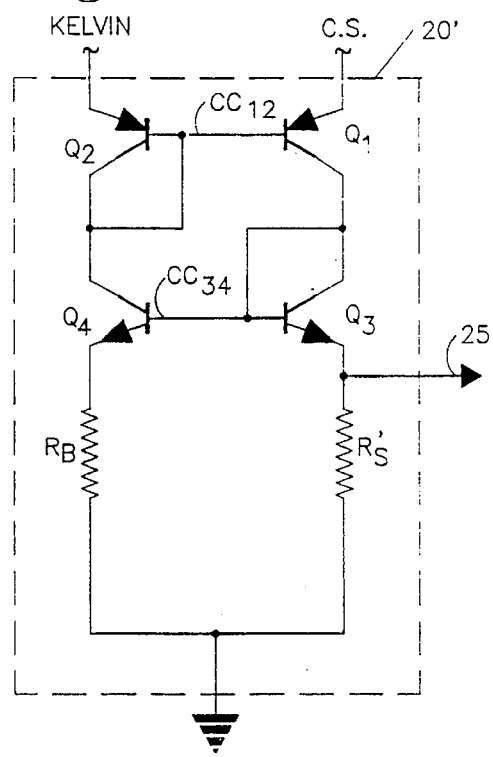
FIG. 2 is a schematic circuit diagram depicting, in detail, one embodiment of the current sensing circuit of the invention.
Figure 3:
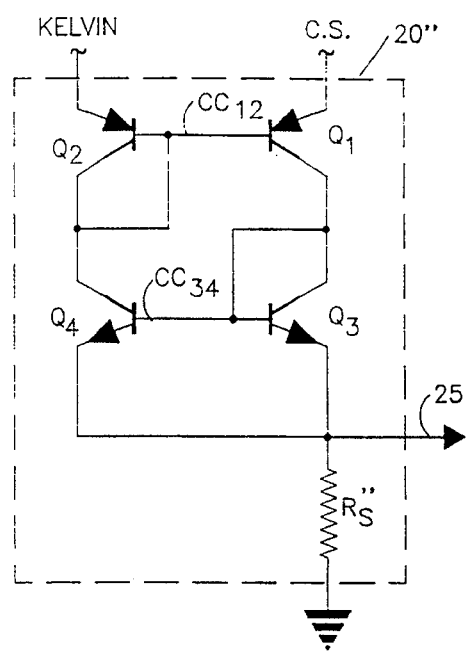
FIG. 3 is a schematic circuit diagram depicting, in detail, a second embodiment of the current sensing circuit of the invention.
Figure 4:
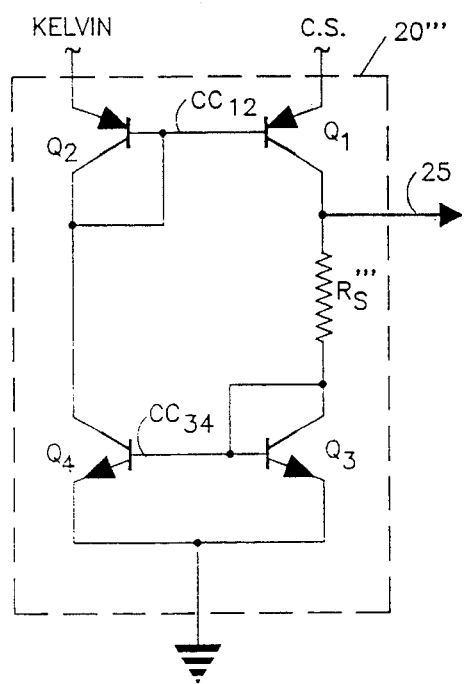
FIG. 4 is a schematic circuit diagram depicting, in detail, a third embodiment of the current sensing circuit of the invention.
Figure 5:
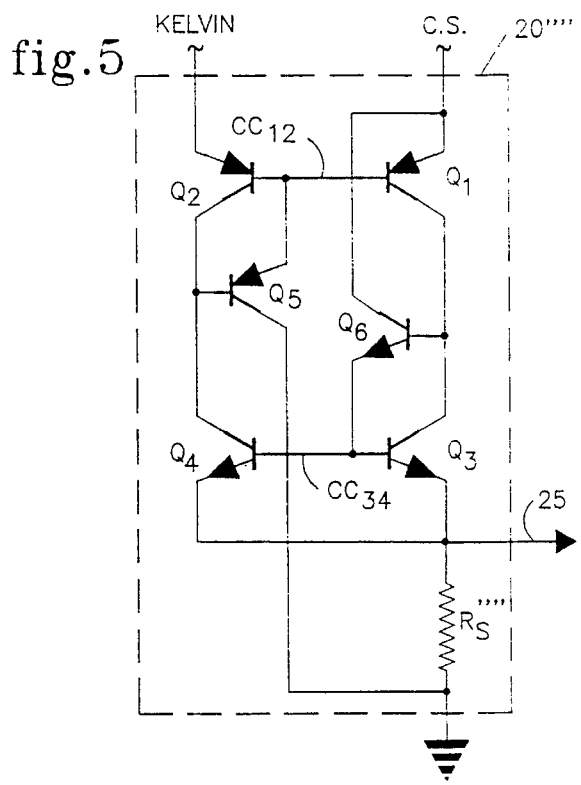
FIG. 5 is a schematic circuit diagram depicting, in detail, a fourth embodiment of the current sensing circuit of the invention.
Figure 6:
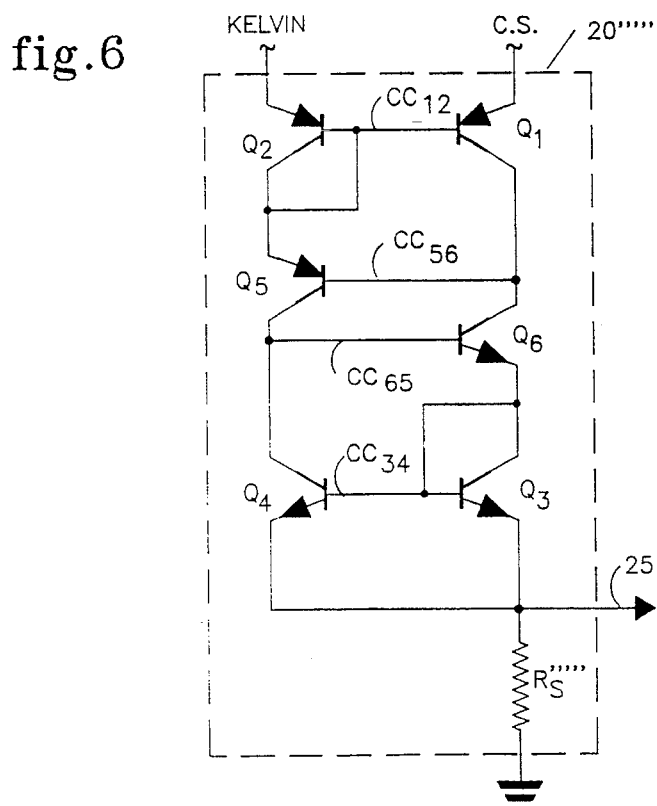
FIG. 6 is a schematic circuit diagram depiction in detail, a fifth embodiment of the current sensing circuit of the invention.

For a better understanding of the current sensing circuitry 20 depicted generally in FIG. 1, reference is made to several alternative, specific embodiments thereof as depicted in FIGS. 2, 3, 4, 5, and 6 respectively. To emphasize any differences between those circuits, the current sensing circuit of FIG. 2 is designated 20' that of FIG. 3 is designated 20", that of FIG. 4 is designated 20''' that of FIG. 5 is designated 20'''' and that of FIG. 6 is designated 20'''''. On the other hand, the transistors $Q_1$–$Q_4$ each bear the same identifying reference and will typically be the same from one circuit to the next, though some variation is contemplated within the scope of the invention. Additionally, FIGS. 5 and 6 have transistors $Q_5$ and $Q_6$. In each instance, it is important that the betas (β) of transistors $Q_1$ and $Q_2$ be the same and the betas of transistors $Q_3$ and $Q_4$ be the same. Thus, transistors $Q_1$ and $Q_2$ are preferably two matched PNP transistors and transistors $Q_3$ and $Q_4$ are two matched NPN transistors. In some instances, it may also be desirable that the betas (β) of transistors $Q_1$ and $Q_2$ be the same as those of transistors $Q_3$ and $Q_4$. Higher values of beta result in more accurate current mirroring between $Q_1$ and $Q_2$ and between $Q_3$ and $Q_4$. The end result is that the base-emitter voltages of $Q_1$ and $Q_2$, and thus the voltages at the C.S. and Kelvin terminals, will become more equal. The transistors in these exemplary embodiments are incorporated in an integrated circuit.

The sense impedance or resistance across which the sense voltage is developed, has been designated $R_S'$ in FIG. 2, $R_S''$ in FIG. 3, $R_S'''$ in FIG. 4, $R_S''''$ in FIG. 5 and $R_S'''''$ in FIG. 6. While the function of sense resistor $R_S'$–$R_S''''$ is similar in each of those embodiments, its actual value and positioning within the circuit may vary somewhat. Accordingly, the superscripted primes have been applied for ease of identification. In each instance, the sense resistor $R_S'$–$R_S''''$ will appear in serial circuit with the transistors $Q_1$ and $Q_3$ in branch $BR_1$ and which is in turn connected to the current sense terminal C.S. of current sense switch $S_1$.

Referring to FIG. 2, the current sensing circuit 20' includes transistors $Q_1$ and $Q_3$ connected in serial circuit between current sense terminal C.S. and ground. It further includes transistors $Q_2$ and $Q_4$ connected in serial circuit between the Kelvin terminal and ground. Transistor $Q_2$ is connected in a shorted base-to-collector configuration and has its base cross-connected to the base of transistor $Q_1$ via cross-connection $CC_{12}$. Transistor $Q_2$ effectively provides a bias signal for controlling transistor $Q_1$. Connected this way, transistor $Q_2$ acts like a diode, thereby regulating the base-to-emitter voltage of transistor $Q_1$ and thus controlling the base current of transistor $Q_1$. In this configuration, transistors $Q_1$ and $Q_2$ constitute an impedance matching buffer connected to the Kelvin terminal K and current sense terminal C.S. of the sensing switch $S_1$.

Transistor $Q_3$ is connected in a shorted base-to-collector configuration and its base is connected to the base of transistor $Q_4$ via cross-connection $CC_{34}$. The collector of transistor $Q_3$ is connected to collector of transistor $Q_1$ and the collector of transistor $Q_4$ is connected to the collector of transistor $Q_2$. Transistor $Q_3$ serves to provide a bias control signal to the transistor $Q_4$ via the cross-connection $CC_{34}$. Transistors $Q_3$ and $Q_4$ operate as a current mirror to maintain near-equal collector currents, and therefore base-emitter voltages, through transistors $Q_1$ and $Q_2$.

It can be appreciated that one can ratio the emitter areas of the transistors in $BR_1$, i.e. $Q_1$ and $Q_3$, versus the emitter areas of the transistors in $BR_2$, i.e. $Q_2$ and $Q_4$, to decrease the power dissipation in one leg of the current sensing circuit. The collector current in transistor $Q_3$ will not be equal but will be proportional to the collector current in transistor $Q_4$ by the same proportional difference in the emitter area of the two transistors. The same effect occurs for transistors $Q_1$ and $Q_2$. The end result is that the base-emitter voltages of $Q_1$ and $Q_2$ will be equal while the power dissipation in the current sensing circuit will be decreased.

A bias resistor $R_B$ is connected in series circuit with the transistors $Q_2$ and $Q_4$, with one end connected to the emitter of transistor $Q_4$ and the other connected to ground potential. The inclusion of resistor $R_B$ helps to minimize the power dissipation through transistor $Q_4$ which might otherwise become significant if high currents are being sensed and/or the transistors are contained in an integrated circuit. The sense resistor $R_S'$ is connected between the emitter of transistor $Q_3$ and ground in the first branch circuit. The sense voltage is provided at an output node appearing at the junction between the resistor $R_S'$ and the emitter of transistor $Q_3$. The sense voltage is thus the differential voltage appearing across the sense resistor $R_S'$. Changes in the "on-resistance" of the current sense MOSFETs have no significant affect on the stability of the sense current ratio. The sense resistor $R_S'$ is referenced to ground, which results in the sense voltage being independent of the actual potential of the supply voltage, $V_{BATT}$. It will be understood that the potential of $V_{BATT}$, which is nominally 12 volts, may be expected to vary between a potential as low as 6 volts and as high as 45 volts or more during transients. This circuit is also relatively insensitive to load current changes. For high-side drives or situations in which the current sensing circuitry is connected to a high-side switch, there is no requirement for the comparator to have a common-mode voltage near equal to the potential of the supply voltage $V_{BATT}$, and the voltage reference is independent of that supply voltage. Further, the sense voltage can be an order of magnitude or more larger than prior art circuits, such as in U.S. Pat. No. 4,654,568, such that amplification is not required.

An alternative to the current sensing circuitry of 20' of FIG. 2 is depicted in the current sensing circuitry of 20" of FIG. 3. That circuit is structured similarly to that of FIG. 2 with respect to the arrangement of the four transistors $Q_1$-$Q_4$, however it omits the use of a separate biasing resistor $R_B$ in the second branch. Instead, a sense resistor $R_S''$ appears not only in serial circuit with transistors $Q_1$ and $Q_3$ of the first branch, but is also shared in serial circuit with transistors $Q_2$ and $Q_4$ of the second branch. The use of a single resistor $R_S''$ provides at least two advantages over the circuitry of FIG. 2, the first being that one less input/output (I/O) pin is needed if it is assumed that the transistors are part of an integrated circuit and the resistances are external discrete devices. Secondly, there is no dependency on current ratio due to resistor matching between $R_S'$ and $R_B$. Of course the value of $R_S''$ will have to be selected such that it provides the requisite sense voltage level for anticipated conditions. The tolerance of the resistor $R_S''$ continues to affect the ability to sense accurately because that sensing is actually a voltage and not the current. However, it will be appreciated that very low tolerances in $R_S''$ come at a very low cost penalty.

Referring now to the current sensing circuitry 20''' in FIG. 4, there is depicted another alternative to the arrangements of FIG. 2 and FIG. 3. Relative to the current sensing circuits 20' and 20'' of FIGS. 2 and 3 respectively, the inverted current mirror $Q_1$ and $Q_2$ and the current mirror $Q_3$ and $Q_4$ of circuit 20''' functions in a substantially similar manner. On the other hand, circuitry 20''' employs a single sense resistor $R_S'''$ located in the first branch in serial connection between the collector of $Q_1$ and the collector of $Q_3$. No separate resistor is contained in the second branch with transistors $Q_2$ and $Q_4$. Although reliance upon a single resistor $R_S'''$ in current sensing circuit 20''' may serve to reduce the count of resistive elements employed, it may not reduce the number of I/O pins if the transistors are part of an integrated circuit since one end of resistor $R_S'''$ would have to be connected to transistor $Q_3$ and the other end would have to be connected to the collector of transistor $Q_1$. Moreover, the omission of a resistance in the serial branch having transistors $Q_2$ an $Q_4$ may result in a greater-than-desired power dissipation through transistor $Q_4$ in the event of high sense currents. Still further, the positioning of sense resistor $R_S'''$ between transistors $Q_3$ and $Q_1$ further introduces an offset voltage occasioned by the $V_{BE}$ of transistor $Q_3$. For that latter reason, it may be more desirable to sense the differential voltage across the sense resistor, which is more conveniently done in the embodiments of FIG. 2 and FIG. 3.

In FIG. 5 there is depicted a further refinement of the invention, in which the current sensing circuit 20'''' includes, in addition to the transistors $Q_1$ through $Q_4$ described above, fifth and sixth transistors $Q_5$ and $Q_6$ respectively. The base of PNP transistor $Q_5$ is connected to the collectors of transistors $Q_2$ and $Q_4$. The emitter of transistor $Q_5$ is connected to the common-base connection $CC_{12}$ of transistors $Q_1$ and $Q_2$, and the collector of transistor $Q_5$ is connected to the reference potential. Transistor $Q_5$ replaces the shorted base-to-collector connection of transistor $Q_2$. Likewise, the base of NPN transistor $Q_6$ is connected to the collectors of transistors $Q_1$ and $Q_3$. The emitter of transistor $Q_6$ is connected to the common-base connection of transistors $Q_3$ and $Q_4$, and the collector of transistor $Q_6$ is connected to the emitter of transistor $Q_1$. Transistor $Q_6$ replaces the shorted base-to-collector connection of transistor $Q_3$. The addition of transistors $Q_5$ and $Q_6$ in this manner results in current sensing circuit 20'''' being less sensitive to beta variations, and thus temperature, in transistors $Q_1$ through $Q_4$. As in the embodiment of FIG. 3, a sense resistor $R_S''''$ is connected at one end to the reference potential and at the other end to transistor $Q_3$ of branch 1 and to transistor $Q_4$ of branch 2. The sense voltage signal 25 appears at the node between resistor $R_S''''$ and the emitters of transistors $Q_3$ and $Q_4$.

In FIG. 6 there is depicted yet a further embodiment of the invention in which the current sensing circuit 20''''' includes fifth and sixth transistors $Q_5$ and $Q_6$ respectively, connected in an alternate configuration from that of FIG. 5. Transistors $Q_1$ and $Q_2$ and transistors $Q_3$ and $Q_4$ are cross-connected at their respective bases by $CC_{12}$ and $CC_{34}$ respectively as in the embodiment of FIG. 3. Similarly, the collectors of transistors $Q_2$ and $Q_3$ are shorted to their respective bases. Similarly also, the sense resistor $R_S'''''$ is not only in serial circuit with transistors $Q_1$ and $Q_3$ of the first branch, but is also shared in serial circuit with transistors $Q_2$ and $Q_4$ of the second branch. The sense voltage 25 is obtained at the junction node between resistor $R_S'''''$ and the emitters of transistors $Q_3$ and $Q_4$. However, transistors $Q_5$ and $Q_6$ are serially connected in the second and the first branches respectively.

More particularly in FIG. 6, transistor $Q_5$ is of the PNP type and has its emitter connected to the collector of transistor $Q_2$ and its collector connected to the collector of transistor $Q_4$. Transistor $Q_6$ is of the NPN type and has its emitter connected to the collector of transistor $Q_3$ and its collector connected to the collector of transistor $Q_1$. The base of transistor $Q_5$ is connected across to the collector of transistor $Q_6$ in the first branch by cross-connection $CC_{56}$. The base of transistor $Q_6$ is connected across to the collector of transistor $Q_5$ in the second branch via cross-connection $CC_{65}$.

Owing to the so-called Early voltage effect, changes in the voltage across a transistor may cause a change in its beta (β). Thus, for changes in the supply voltage $V_{BATT}$, the voltages across the transistors operating in the transimpedance mode, i.e., $Q_1$ and $Q_4$, will change and will affect their betas (β) relative to the betas (β) of their respective mirroring transistors $Q_2$ and $Q_3$ and thus cause variations in the ratios. However, the addition of transistors $Q_5$ and $Q_6$, connected as shown in FIG. 6, serves to drop most of the voltage across those two transistors, thereby minimizing voltage changes across transistors $Q_1$ and $Q_4$ and thus minimizing the undesirable Early voltage effects. This results in improved performance over the range of possible variation in the supply voltage since the voltage across transistors $Q_3$ and $Q_4$ differ by only a diode drop, regardless of supply voltage. However, circuit 20'''' does exhibit a slightly larger voltage drop across the active elements of each branch than do the other embodiments, which results in somewhat of a decrease in operating voltage range for a given sense current.

It should be understood that the invention is not limited to the particular embodiments shown and described herein, but that various changes and modifications may be made without departing from the spirit and scope of this novel concept as defined by the following claims. By way of example, the current sensing MOSFETs might be used as linear control devices rather than as switches; the major and minor current-carrying cellular portions of the current sensing devices might be simply a relatively large cell of greater current-carrying capacity and a smaller cell of much less capacity; the output signal 25 might be utilized or monitored in a linear manner rather than with respect only to a threshold; and the current sensing circuitry might be either in fully integrated circuit form, or it may be all or partly comprised of discrete components.

We claim:

1. A power delivery circuit for supplying load current to a load, comprising:

a power FET device comprising a majority current device for supplying a majority current output to a load, a minority current device for supplying a minority current output, and a terminal whose voltage is representative of the voltage at the output of the majority current device;

a current detection circuit for obtaining a signal proportional to said majority current output, the current detection circuit comprising:

a first branch connected between said terminal and a reference potential, and a second branch connected between said minority current output and said reference potential;

said first branch having a first semiconductor device and said second branch having a second semiconductor device, wherein said first and said second semiconductor devices are configured to control the voltage at said minority current output;

said first branch having a third semiconductor device and said second branch having a fourth semiconductor device, said third and fourth semiconductor devices being configured to provide a predetermined current ratio in said first and second branches; and, at least one output node for providing said signal proportional to said majority current output.

2. The power delivery circuit of claim 1, wherein the signal proportional to the majority current output is a voltage signal.

3. The power delivery circuit of claim 1, wherein the signal proportional to the majority current output is a differential voltage signal comprising the voltage between said at least one output node and a second output node.

4. The power delivery circuit of claim 1, further comprising a fifth transistor to provide a current path for the base currents of said third and fourth semiconductor devices.

5. The power delivery circuit of claim 1, further comprising a fifth transistor to provide a current path for the base currents of said first and second semiconductor devices.

6. The power delivery circuit of claim 1, further comprising fifth and sixth semiconductor devices, said fifth semiconductor device interposed in series connection between said first and third semiconductor devices, and said sixth semiconductor device interposed in series connection between said second and fourth semiconductor devices.

7. A power delivery circuit for supplying load current to a load, comprising:

a power FET device comprising a majority current device for supplying a majority current output to a load, a minority current device for supplying a minority current output, and a terminal whose voltage is representative of the voltage at the output of said majority current device;

a current detection circuit for obtaining a signal proportional to said majority current output, the current detection circuit comprising:

a voltage matching buffer circuit comprising first and second semiconductor devices, said first semiconductor device coupled to said minority current output and said second semiconductor device coupled to said terminal; and a current controlling circuit comprising third and fourth semiconductor devices driving said voltage matching buffer circuit so as to draw first and second currents through said first and second semiconductor devices, wherein said first and second currents are in a predetermined ratio;

at least one output node for providing said signal proportional to said majority current output.

8. The power delivery circuit of claim 7, wherein said signal proportional to said majority current output is a voltage signal.

9. The power delivery circuit of claim 7, wherein said signal proportional to said majority current output is a differential voltage signal comprising the voltage between said at least one output node and a second output node.

10. The power delivery circuit of claim 7, further comprising a fifth transistor to provide a current path for the base currents of said third and fourth semiconductor devices.

11. The power delivery circuit of claim 7, further comprising a fifth transistor to provide a current path for the base currents of said first and second semiconductor devices.

12. The power delivery circuit of claim 7, further comprising fifth and sixth semiconductor devices, said fifth semiconductor device interposed in series connection between said first and third semiconductor devices, and said sixth semiconductor device interposed in series connection between said second and fourth semiconductor devices.

13. An improved current sensing circuit for use in combination with a current controlling device in a power delivery circuit for supplying load current to a load, the current controlling device being multi-cellular, and having parallel-connected major current-carrying cells for outputting a main device current and at least one minor current-carrying cell to output a current proportional to the main device current, the improvement in the current sensing circuit comprising:

a buffer circuit comprising first and second semiconductor devices, said first semiconductor device coupled to the output of said minor current-carrying cell and said second semiconductor device coupled to output of said parallel-connected major current-carrying cells, for controlling voltage at the output of said at least one minor current-carrying cell; and a current controlling circuit comprising third and fourth semiconductor devices driving said buffer circuit so as to draw first and second currents through said first and second semiconductor devices, wherein said first and second currents are in a predetermined ratio;

at least one output node for providing a signal proportional to said main device current.

14. The current sensing circuit of claim 13, wherein said first, second, third, and fourth semiconductor devices include first, second, third, and fourth bipolar transistors respectively, said first and second bipolar transistors being of PNP-type conductivity and said third and fourth bipolar transistors being of NPN-type conductivity.

15. The current sensing circuit of claim 14, wherein the bases of said first and second bipolar transistors of said buffer circuit are intercoupled, and the bases of said third and fourth bipolar transistors of said current controlling circuit are intercoupled.

16. The current sensing circuit of claim 15, wherein said intercoupled bases of said first and second bipolar transistors are coupled to the collector of one of said first and second bipolar transistors.

17. The current sensing circuit of claim 15, wherein said intercoupled bases of said third and fourth bipolar transistors are coupled to the collector of one of said third and fourth bipolar transistors.

18. The current sensing circuit of claim 15, further comprising a fifth transistor to provide base currents to said third and fourth bipolar transistors.

19. The current sensing circuit of claim 15, further comprising a fifth transistor to provide a current path for the base currents of said first and second bipolar transistors, said current path extending between said intercoupled bases of said first and second bipolar transistors and a reference potential.

20. The current sensing circuit of claim 14, further comprising fifth and sixth semiconductor devices, wherein said fifth semiconductor is connected in series between said second and said fourth semiconductor devices and said sixth semiconductor is connected in series between said first and said third semiconductor devices.

21. The current sensing circuit of claim 14, further comprising fifth and sixth semiconductor devices, said fifth semiconductor device interposed in series connection between said first and third semiconductor devices, and said sixth semiconductor device interposed in series connection between said second and fourth semiconductor devices.

22. The current sensing circuit of claim 14, wherein the betas ($\beta$) of said first and said second transistors are substantially identical, and the betas ($\beta$) of said third and said fourth transistors are substantially identical.

23. The current sensing circuit of claim 13, wherein said third and fourth semiconductor devices of said current controlling circuit are intercoupled to form a current mirror.

24. The current sensing circuit of claim 23, wherein said third and said fourth semiconductor devices of said current controlling circuit comprise FET transistors.

25. The current sensing circuit of claim 24, wherein said current controlling circuit further comprises a fifth semiconductor device intercoupled with said third and fourth semiconductor devices no form a current mirror.

26. The current sensing circuit of claim 13, wherein said buffer circuit further comprises a fifth semiconductor device intercoupled with said first and second semiconductor devices.

27. The current sensing circuit of claim 26, wherein said fifth semiconductor device provides a current path for base currents of said intercoupled semiconductor devices and a reference potential.

28. The current sensing circuit of claim 13, further comprising fifth and sixth semiconductor devices, wherein said fifth semiconductor is connected in series between said second and said fourth semiconductor devices and said sixth semiconductor is connected in series between said first and said third semiconductor devices.

29. The current sensing circuit of claim 13, further comprising fifth and sixth semiconductor devices interposed in series connection between said buffer circuit and said current controlling circuit.

30. An improved current sensing circuit for use in combination with a current controlling device in a power delivery circuit for supplying load current to a load, the current controlling device being multi-cellular, and having parallel-connected major current-carrying cells for outputting a main device current and at least one minor current-carrying cell to output a current proportional to the main device current, the improvement in the current sensing circuit comprising:

a buffer circuit comprising first and second semiconductor devices, said first semiconductor device coupled to the output of said minor current-carrying cell and said second semiconductor device coupled to output of said parallel-connected major current-carrying cells, for controlling voltage at the output of said at least one minor current-carrying cell; and a current controlling circuit comprising third and fourth semiconductor devices driving said buffer circuit so as to draw first and second currents through said first and second semiconductor devices, wherein said first and second currents are in a predetermined ratio;

fifth and sixth semiconductor devices interposed in series connection between said buffer circuit and said current controlling circuit; and, at least one output node for providing a signal proportional to said main device current.

\* \* \* \* \*

UNITED STATES PATENT AND TRADEMARK OFFICE
CERTIFICATE OF CORRECTION

PATENT NO. : 5,495,155
DATED : FEB. 27, 1996
INVENTOR(S) : DAVID L. JUZSWIK and BRUCE R. WRENBECK It is certified that error appears in the above-identified patent and that said Letters Patent is hereby corrected as shown below:

Title page, item[54] in the Title, before "DEVICE IN A POWER DELIVERY CIRCUIT" insert -- CURRENT SENSING CIRCUIT FOR USE WITH A CURRENT CONTROLLING --; item [73] Assignee, delete "Corporation" and insert -- Automotive, Inc. --; in the Related U.S. Application Data, after " Pat. No. 5,210,475", insert --, which is a Division of Ser. No. 07/577,823, Sep. 4, 1990, Pat. No. 5,032,774, which is a continuation of Ser. No. 07/430,916, Oct. 30, 1989, abandoned, which is a continuation of Ser. No. 07/349,022, May 9, 1989, abandoned--.

Column 1, in the title, before "DEVICE IN A POWER DELIVERY CIRCUIT" insert -- CURRENT SENSING CIRCUIT FOR USE WITH A CURRENT CONTROLLING --;

Column 1, line 6, after " 5,210,475", insert --, which is a Division of Ser. No. 07/577,823, Sep. 4, 1990, Pat. No. 5,032,774, which is a continuation of Ser. No. 07/430,916, Oct. 30, 1989, abandoned, which is a continuation of Ser. No. 07/349,022, May 9, 1989, abandoned--.

Signed and Sealed this

Fourteenth Day of January, 1997

*Attest:*

BRUCE LEHMAN

*Attesting Officer*  *Commissioner of Patents and Trademarks*